(12) United States Patent
Gardner et al.

(10) Patent No.: US 6,274,442 B1
(45) Date of Patent: Aug. 14, 2001

(54) TRANSISTOR HAVING A NITROGEN INCORPORATED EPITAXIALLY GROWN GATE DIELECTRIC AND METHOD OF MAKING SAME

(75) Inventors: Mark I. Gardner, Cedar Creek; H. Jim Fulford, Jr.; Charles E. May, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/116,417

(22) Filed: Jul. 15, 1998

(51) Int. Cl.[7] ................................................. H01L 21/336
(52) U.S. Cl. ............................................. 438/287; 438/413
(58) Field of Search .................................... 438/588, 591, 438/592, 593, 643, 261, 287, 406, 413; 257/607, 344, 345, 408, 655, 914, 287

(56) References Cited

U.S. PATENT DOCUMENTS

| | | |
|---|---|---|
| 4,120,700 | 10/1978 | Morimoto . |
| 4,559,096 | 12/1985 | Friedman et al. . |
| 4,929,489 | 5/1990 | Dreschoff et al. . |
| 5,070,046 | 12/1991 | Hu . |

(List continued on next page.)

FOREIGN PATENT DOCUMENTS

| | | |
|---|---|---|
| AU 2503 | 11/1991 | (EP) . |
| 59-228764 | 12/1984 | (JP) . |

OTHER PUBLICATIONS

Yamada et al. "Gas Cluster Ion Beam Processing ULSI Fabrication," Reprinted from Materials Research Society Symposium Proceedings vol. 427, *Advanced Metallization for Future ULSI*.

Raaijamakers "Low Temperature Metal—Organic Chemical Vapor Deposition of Advanced Barrier Layers for the Microelectronics Industry," *Thin Solid Films*, 247 (1994) pp. 85–93.

*Primary Examiner*—Stephen D. Meier
*Assistant Examiner*—Jeff Vockrodt
(74) *Attorney, Agent, or Firm*—Kevin L. Daffer; Conley, Rose & Tayon P.C.

(57) ABSTRACT

An integrated circuit fabrication process is provided for incorporating barrier atoms, preferably nitrogen atoms, within a barrier layer. The barrier layer is interposed between the gate dielectric and the semiconductor substrate. The barrier layer serves to inhibit the passage of dopants from the gate conductor into the channel area. The barrier layer is preferably a nitrogen doped silicon epitaxial layer. The barrier layer may be composed of two layers, a silicon epitaxial layer and a nitrogen doped epitaxial layer formed upon the silicon epitaxial layer.

5 Claims, 3 Drawing Sheets

U.S. PATENT DOCUMENTS

| | | |
|---|---|---|
| 5,111,355 | 5/1992 | Anand et al. . |
| 5,142,438 | 8/1992 | Reinberg et al. . |
| 5,186,718 | 2/1993 | Tepman et al. . |
| 5,246,884 | 9/1993 | Jaso et al. . |
| 5,258,333 * | 11/1993 | Shapir et al. .......... 438/762 |
| 5,281,554 | 1/1994 | Shimada et al. . |
| 5,304,503 | 4/1994 | Yoon et al. . |
| 5,364,468 * | 11/1994 | Cho .......... 148/33.3 |
| 5,407,870 * | 4/1995 | Okada et al. .......... 438/591 |
| 5,426,327 | 6/1995 | Murai . |
| 5,428,240 | 6/1995 | Lur . |
| 5,464,783 * | 11/1995 | Kim et al. .......... 438/591 |
| 5,478,765 * | 12/1995 | Kwong et al. .......... 438/762 |
| 5,514,902 * | 5/1996 | Kawasaki et al. .......... 257/607 |
| 5,552,337 | 9/1996 | Kwon et al. . |
| 5,593,907 | 1/1997 | Anjum et al. . |
| 5,627,087 | 5/1997 | Hsu . |
| 5,648,286 | 7/1997 | Gardner et al. . |
| 5,677,015 | 10/1997 | Hasegawa . |
| 5,726,087 * | 3/1998 | Tseng et al. .......... 438/261 |
| 5,783,365 * | 7/1998 | Tsujita .......... 430/311 |
| 5,804,482 * | 9/1998 | Konstantinov et al. .......... 438/268 |
| 5,837,598 * | 11/1998 | Aronowitz et al. .......... 438/532 |
| 5,885,877 * | 3/1999 | Gardner et al. .......... 438/300 |
| 5,955,745 * | 9/1999 | Yamazaki .......... 257/63 |
| 6,027,992 * | 2/2000 | Gardner et al. .......... 438/588 |
| 6,064,077 * | 5/2000 | Sandaresan .......... 257/23 |

* cited by examiner

TRANSISTOR HAVING A NITROGEN INCORPORATED EPITAXIALLY GROWN GATE DIELECTRIC AND METHOD OF MAKING SAME

BACKGROUND OF THE INVENTION

1. Field of the Invention

This invention relates to integrated circuit fabrication and, more particularly, to a process in which a nitrogen incorporated epitaxial layer is interposed between a gate dielectric and a semiconductor substrate to serve as a barrier layer therebetween.

2. Description of the Related Art

Fabrication of metal-oxide-semiconductor ("MOS") transistors is well-known. The manufacturing process begins by lightly doping a single crystalline silicon substrate with n-type or p-type species. Active areas of the substrate in which the transistors and other active devices will reside are then isolated from other active areas with isolation structures. Isolation structures may comprise shallow trenches in the substrate which are filled with a dielectric. Isolation structures may alternatively comprise local oxidation of silicon ("LOCOS") structures. A gate oxide (i.e., silicon dioxide) is then formed upon the substrate by thermally oxidizing the silicon-based substrate. A gate conductor is formed by depositing polycrystalline silicon ("polysilicon") upon the gate dielectric, followed by patterning the polysilicon using typical masking and etching techniques. Subsequently, the polysilicon gate conductor and source/drain regions arranged within the substrate on opposite sides of the gate conductor are concurrently doped with a high dosage of n-type or p-type dopants. If the impurity dopant is n-type, then the resulting transistor is referred to as an NMOS device. Conversely, if the impurity dopant is p-type, then the resulting transistor is referred to as a PMOS device. An integrated circuit which employs both NMOS and PMOS devices is generally known as a complementary MOS or CMOS circuit.

The resistivity of the polysilicon gate conductor is reduced by the introduction of impurities into the structure. Enough dopants are introduced so that the sheet resistance of the gate conductor is reduced to, in some instances, less than approximately 500 ohms/sq. In an ion implantation process, the depth at which the dopants are implanted can be controlled by adjusting the energy provided to the ions by the ion implantation equipment. However, the minimum depth of implantation is limited to between 200Å and 400Å because the energy of each ion is typically too large to permit a lesser depth of implantation.

Subsequent processing steps may require heating of the semiconductor topography. For example, a post-implant anneal is often performed to position and activate the dopants implanted into the source/drain regions and the gate conductor. Dopants with a high diffusivity typically migrate to greater depths within the polysilicon gate than dopants with a low diffusivity. For instance, boron, which is commonly used to dope the polysilicon gate and the source/drain regions of an NMOS device, undergoes fast diffusion. On the other hand, arsenic, which is typically used to dope the polysilicon gate and the source/drain regions of a PMOS device, is a slow diffuser. Unfortunately, dopants, like boron, which readily migrate during heat treatment may diffuse from the gate conductor through the gate oxide and into the channel region of the transistor. Boron penetration into the channel can lead to undesirable effects, such as an increase in electron trapping, a decrease in low-field hole mobility, degradation of the transistor drive current, and increased subthreshold current.

In an attempt to prevent the diffusion of impurities into the channel region, barrier atoms are commonly incorporated into the gate oxide/channel interfacial region. For example, nitrogen is commonly introduced into the interfacial region by annealing the semiconductor topography in an ambient comprising $N_2$. Available N atoms may react with Si atoms and O atoms of the gate oxide to form silicon oxynitride ("oxynitride"), terminating any dangling bonds within the gate oxide. The presence of strong N-O bonds of oxynitride throughout the gate oxide would serve to reduce the entrapment of hot carriers within the gate oxide. Further, single N atoms would block the migration pathways into and through the gate oxide, inhibiting fast diffusing impurities from passing from the gate conductor into the channel region.

Unfortunately, only a small fraction (e.g., 1/1000) of the $N_2$ molecules actually break up into separate N atoms upon entering the gate oxide. It is believed that the $N_2$ molecules, unlike individual N atoms, may be too large to fill interstitial positions and vacancies within the gate oxide. Consequently little if any protection against impurity diffusion through the gate oxide is accomplished by the $N_2$ diffusion process.

Ion implantation of barrier atoms, e.g., N atoms, into the gate oxide/channel interfacial region has also been employed as a barrier to hot carriers or to prevent species from passing into and out of the gate oxide. The gate oxide may be less than 50Å thick to ensure high capacitive coupling between the channel and the gate conductor. Ion implantation involves accelerating the ions in an electric field to increase the energy of each ion to greater than 10 keV. Absent the ability to achieve lower energies for the ions, the ions are implanted into a medium to a minimum depth of between 200 and 400Å. Accordingly, atoms implanted into the gate oxide are situated and thereafter tend to migrate well-below the gate oxide/channel interface. The atoms thusly placed fill no interstitial and vacancy positions within the critical gate oxide. Therefore, the atoms provide little, if any, barrier against the migration of impurities from the gate conductor into the channel and to the injection of hot carriers into the gate oxide.

It would therefore be of benefit to develop a more effective method for forming a diffusion barrier between the gate conductor and the channel region of a transistor to prevent the migration of dopants into the channel region and/or hot carriers into the gate dielectric. Ion implantation of barrier atoms using conventional methods should be avoided to ensure that the diffusion barrier is accurately positioned in the gate dielectric/channel interfacial region. Otherwise, the barrier atoms might be implanted beneath the interfacial region where they would provide little protection against dopant diffusion into the channel. It is also desirable that the concentration of nitrogen atoms be maximized to enhance the barrier properties of the diffusion barrier.

SUMMARY OF THE INVENTION

The problems outlined above are in large part solved by the technique hereof for incorporating barrier atoms within an epitaxial barrier layer. The barrier layer is preferably interposed between the gate dielectric and the semiconductor substrate. The barrier layer serves to inhibit the diffusion of metal atoms and impurities from the gate conductor into the channel region. Furthermore, the barrier layer provides protection against hot carrier injection into and entrapment within the gate dielectric.

According to an embodiment of the present invention, a gate dielectric is formed upon a nitrogen doped silicon epitaxial layer. An epitaxial film growth process is a means of depositing a thin layer of single crystal material upon the surface of a single crystal substrate. A relatively thin (e.g., about 0.3$\mu$m) nitrogen doped silicon epitaxial layer is grown upon a semiconductor substrate. The nitrogen doped silicon epitaxial layer is grown by subjecting the semiconductor substrate to a mixture of a silicon source gas and a nitrogen source gas in a high temperature deposition reactor. This process allows a nitrogen doped silicon epitaxial layer to be formed in which the concentration of nitrogen within the epitaxial layer may be accurately controlled by varying the processing conditions. For example, by increasing or decreasing the amount of nitrogen source gas within the reaction chamber the doping concentration may be increased or decreased, respectively. Therefore, barrier atoms may be placed within a barrier layer at a controlled concentration. According to one embodiment, the process conditions may be selected such that the concentration of nitrogen atoms in the epitaxial layer is greater than about 4%. Concentrations of greater than 4% nitrogen in a silicon epitaxial layer tend to be difficult to produce by ion implantation processing or chemical vapor deposition of silicon nitride layers.

Additionally the position of the barrier layer may be controlled. In a process in which the barrier atoms are implanted by an ion implantation process, the depth to which the ions are implanted tends to be difficult to control. Absent the ability to achieve lower energies for the ions, the ions are typically implanted into a medium to a minimum depth of between 200 and 400Å. Accordingly, atoms implanted into the gate oxide may migrate well-below the gate oxide/channel interface, especially when a relatively thin gate oxide is present. Thus the nitrogen atoms may be placed within a thin epitaxial layer at the desired stage of the process. Preferably, the nitrogen doped silicon epitaxial layer is positioned between the gate dielectric and the semiconductor substrate. Since the nitrogen atoms are substantially contained within the barrier layer during the epitaxial film growth, the nitrogen atoms may be kept out of the channel region. An advantage of the described process is that a relatively thin nitrogen doped barrier layer (e.g., about 3$\mu$m) may be formed. Such a thin barrier layer would be difficult to produce using conventional ion implantation techniques.

Additionally, the described process avoids the damage caused by an ion implantation process. During ion implantation the impact of the ions upon a silicon or silicon dioxide layer may cause damage to the layer, resulting in damage to the lattice of the layer. Such damage may allow dopant atoms to pass through a barrier layer despite the presence of the nitrogen atoms. By introducing the nitrogen during an epitaxial growth sequence the lattice structure is believed to remain intact, thus providing an enhance barrier to dopant leakage. Additionally, the uniform lattice structure of the nitrogen doped barrier layer may provide better bond strength to a subsequently deposited layers.

Additionally, the nitrogen concentration of the epitaxial layer may be formed at concentration that is significantly higher than that achievable by ion implantation methods. By forming a nitrogen doped epitaxial layer the incorporation of nitrogen may approach stoichiometric levels (i.e., Si/N ratio of 1:1). This is typically difficult to achieve by ion implantation, since the a preformed silicon or silicon dioxide layer tends to have a limited number of sites for receiving the implanted ions.

Preferably, the barrier layer is made of two epitaxially grown layers. A silicon epitaxial layer is formed upon the semiconductor substrate. The silicon epitaxial film serves as a barrier to prevent nitrogen from entering the channel region during formation of the nitrogen doped silicon epitaxial layer. The nitrogen doped silicon epitaxial layer is then formed upon the silicon epitaxial layer.

A gate dielectric (e.g., oxide) and a gate conductor (e.g., polysilicon), are subsequently deposited across the barrier layer. The gate conductor and gate dielectric may be patterned to define a pair of opposed sidewall surfaces. A first dopant implant may be performed to form LDD areas within the substrate laterally adjacent the gate conductor. Dielectric sidewall spacers are then formed upon the opposed sidewall surfaces of the gate conductor. A heavier second dopant implant is performed to form source/drain regions spaced from the gate conductor by the sidewall spacers. The second dopant implant may also render the gate conductor conductive by incorporating dopants within the gate conductor. As a result of the second dopant implant, a transistor having graded junctions is formed upon and a semiconductor substrate.

BRIEF DESCRIPTION OF THE DRAWINGS

Other objects and advantages of the invention will become apparent upon reading the following detailed description and upon reference to the accompanying drawings in which.

Figure 1A:
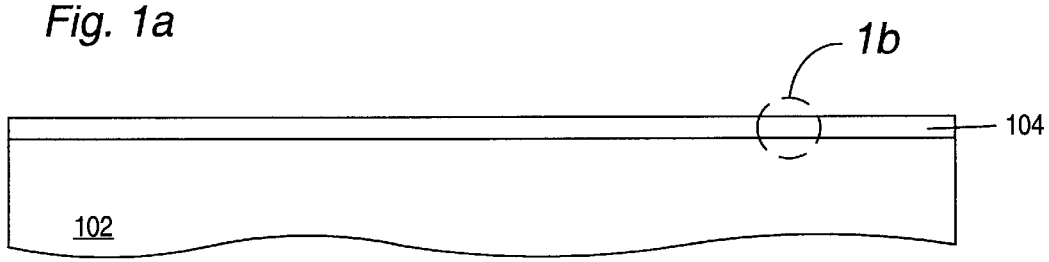
FIG. 1a depicts a partial cross-sectional view of a semiconductor topography wherein a barrier layer is deposited across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIGS. 1–7 illustrate the formation of a transistor according to one embodiment of the present invention. Turning to FIG. 1, a semiconductor substrate 102, preferably composed of single crystalline silicon, is depicted, upon which a gate dielectric 104 is formed. Substrate 102 is slightly doped with p-type dopant species. Although not shown in the depicted cross-section of substrate 102, dielectric isolation regions, such as trench isolation structures, may be arranged spaced distances apart within the substrate for dielectrically isolating the ensuing active areas.

Figure 1B:
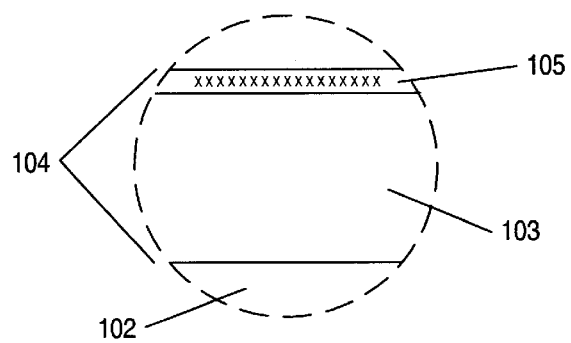
FIG. 1b is a detailed view of one embodiment of the barrier layer of FIG. 1a in which the barrier layer is made of an undoped and a doped layer.

Deposited entirely across substrate 102 is a barrier layer 104, depicted in FIG. 1a. Barrier layer 104 preferably acts, inter alia, as a diffusion barrier between the subsequently formed gate conductor and the channel region of a transistor to prevent the migration of dopants into the channel region. In one embodiment, barrier layer 104 is composed of a nitrogen doped silicon epitaxial layer. In another embodiment, barrier layer 104 is composed of a silicon epitaxial layer 103 and a nitrogen doped silicon epitaxial layer 105, as depicted in FIG. 1b.

Silicon epitaxial layer 103 is preferably formed using a chemical vapor deposition (CVD) system. Either a multi-wafer rf inductively-heated "pancake" reactor or a multiwafer IR radiatively heated "barrel" reactor may be used. In one embodiment, the epitaxial layer is formed by exposing the semiconductor substrate to a silicon source gas in a CVD system. The deposition is preferably performed at a temperature between about 950° C. to about 1250° C. The silicon source gas may be silicon tetrachloride ($SiCl_4$), trichlorosilane ($SiHCl_3$), dichlorosilane ($SiH_2Cl_2$), silane ($SiH_4$), or mixtures of these gases. Under these conditions the growth rate may be between 0.2 $\mu$m/min. to about 3.0 $\mu$m/min. The epitaxial deposition of silicon is preferably conducted for a time period which will produce a silicon epitaxial layer having a depth of up to about 3 $\mu$m.

Nitrogen doped silicon epitaxial layer is formed in a similar manner as described above for the epitaxial silicon layer. In one embodiment, the nitrogen doped epitaxial layer is formed by exposing the semiconductor substrate to a mixed gas which includes a silicon source gas and a nitrogen source gas in a CVD system. The deposition is preferably performed at a temperature between about 950° C. to about 1250° C. The silicon source gas may be silicon tetrachloride ($SiCl_4$), trichlorosilane ($SiHCl_3$), dichlorosilane ($SiH_2Cl_2$), silane ($SiH_4$), or mixtures of these gases. The nitrogen source gas may be nitrogen, ammonia ($NH_3$), or a nitrogen/ammonia mixture. The nitrogen source gas preferably makes up between about 10–20% by volume of the mixed gas, the remainder is primarily made up of the silicon source gas. Under these conditions a silicon epitaxial layer is formed having nitrogen atoms incorporated into the epitaxial layer. The epitaxial deposition of the nitrogen doped silicon epitaxial layer is preferably conducted for a time period which will produce a silicon epitaxial layer having a depth of up to about 0.3 $\mu$m. The concentration of nitrogen atoms within the nitrogen doped silicon epitaxial layer may be greater than 4%.

An advantage of this method is that the depth of the nitrogen incorporation may be readily controlled. When ion implantation is used to insert nitrogen atoms into dielectric layers, the depth of the implantation may be difficult to control due to the high energy required to achieve nitrogen ionization. Typically, the ions are implanted into a medium to a minimum depth of between 200 and 400Å. Accordingly, atoms implanted into a relatively thin gate dielectric may migrate well-below the gate oxide/channel interface. The formation of a nitrogen doped silicon epitaxial layer allows the location, as well as the concentration, of the barrier atoms to be precisely controlled at a predetermined depth.

Figure 2:
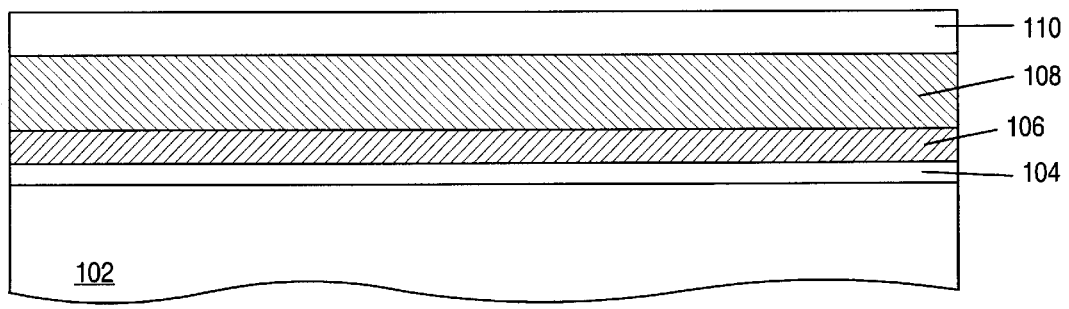
FIG. 2 is a processing step subsequent to FIG. 1a, in which a gate dielectric layer, a gate conductor layer, and a masking layer are deposited across a semiconductor substrate.

Turning to FIG. 2, a gate dielectric layer 106 is preferably formed upon barrier layer 104. The gate dielectric layer 106 is either deposited or grown from a heated, oxygen bearing source. Gate dielectric 106 is preferably formed in a thermal oxidation furnace using temperatures of approximately 700° to 900° C. for a relatively short time (e.g., less than 60 minutes). It is preferred that gate dielectric 106 be grown to a thickness of approximately 15–200 angstroms.

Deposited upon gate dielectric layer 106 is a gate conductor layer 108. Gate conductor layer 108 is preferably composed of polysilicon. Gate conductor layer 108 is preferably deposited using a chemical vapor deposition process (e.g., a plasma enhanced chemical vapor deposition ("PECVD") process). When polysilicon is used as the gate conductor material, the polysilicon may be rendered conductive by implanting impurities into the polysilicon during or after polysilicon deposition. The upper surface of gate conductor layer 108 may be polished to substantially reduce its surface roughness. This polishing may be accomplished by mechanical polishing, chemical-mechanical polishing, or sacrificial etchback.

A masking layer 110 is preferably deposited upon gate conductor layer 108. Masking layer 110 may be composed of silicon oxide, silicon oxynitride, silicon nitride, photoresist material, or any other material that is dissimilar from gate conductor layer 108. Preferably, masking layer 1 10 is composed of photoresist material.

Figure 3:
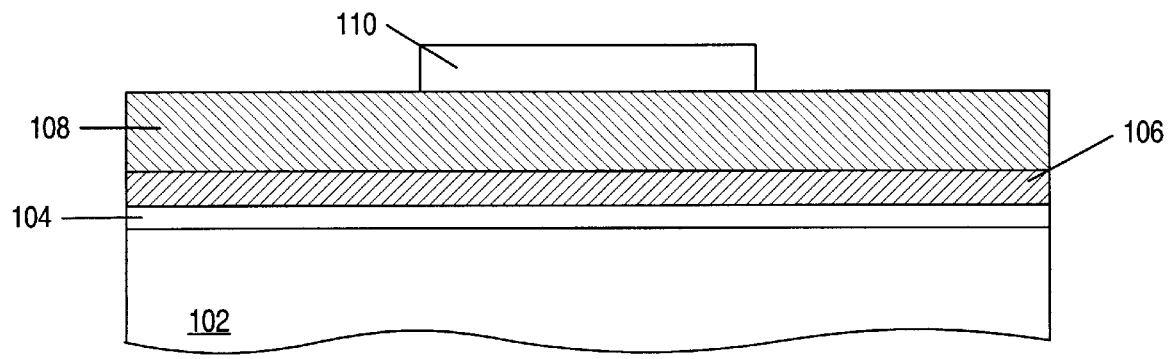
FIG. 3 is a processing step subsequent to FIG. 2, in which the masking layer is patterned to expose portions of the gate conductor layer.
Figure 4:
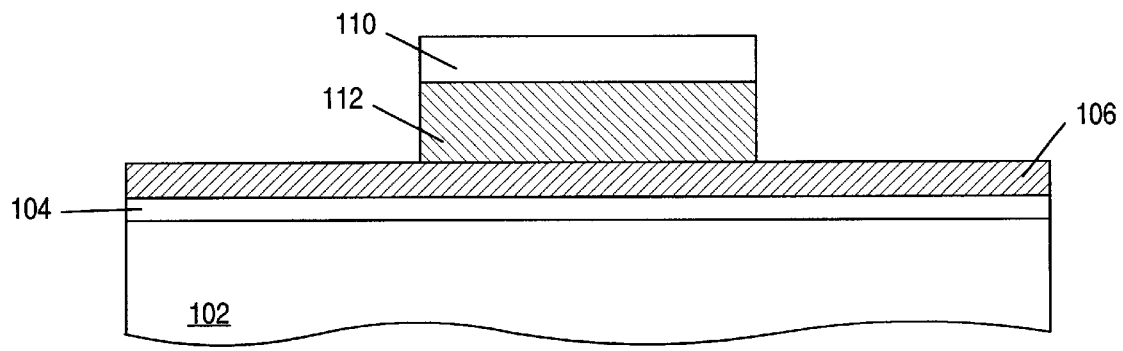
FIG. 4 is a processing step subsequent to FIG. 3, in which the exposed portions of the gate conductor layer are removed.

FIGS. 3–4 illustrate the formation of a gate conductor. Masking layer 110 is selectively patterned and removed from above portions adjacent to the predetermined location of the gate conductor, as depicted in FIG. 3. Portions of gate conductive layer 108 not masked by the remaining masking layer 110 may be removed by using, e.g., an anisotropic dry plasma etch to form gate conductor 112 overlying gate dielectric layer 106, as depicted in FIG. 4. Dielectric layer 106 may be retained upon semiconductor substrate 102 during the etch step.

Figure 5:
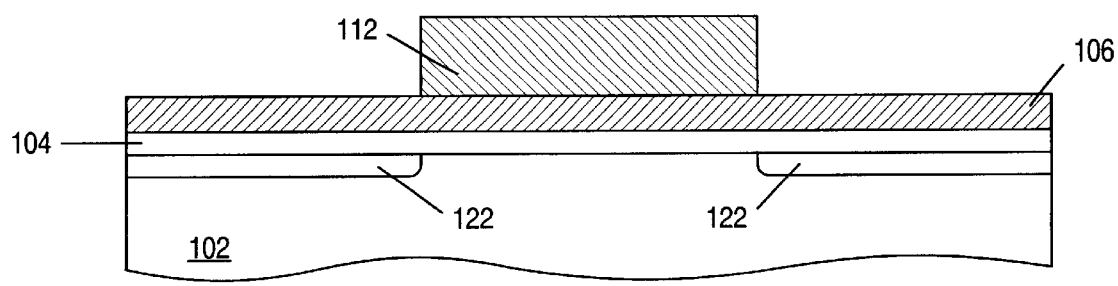
FIG. 5 is a processing step subsequent to FIG. 4, in which a first dopant distribution is forwarded into the semiconductor substrate.

Subsequently, as shown in FIG. 5, a first dopant distribution is implanted into substrate 102. If a PMOSFET transistor is being fabricated, p-type dopant species are implanted; if an NMOSFET transistor is being fabricated, n-type dopant species are implanted. After removal of masking layer 110, a first dopant distribution is forwarded into semiconductor substrate 102 to form LDD areas 122. Gate conductor 112 serves to mask the implant from the channel region. The gate conductor 112 serves to align LDD implant 122 adjacent to the gate conductor.

Figure 6:
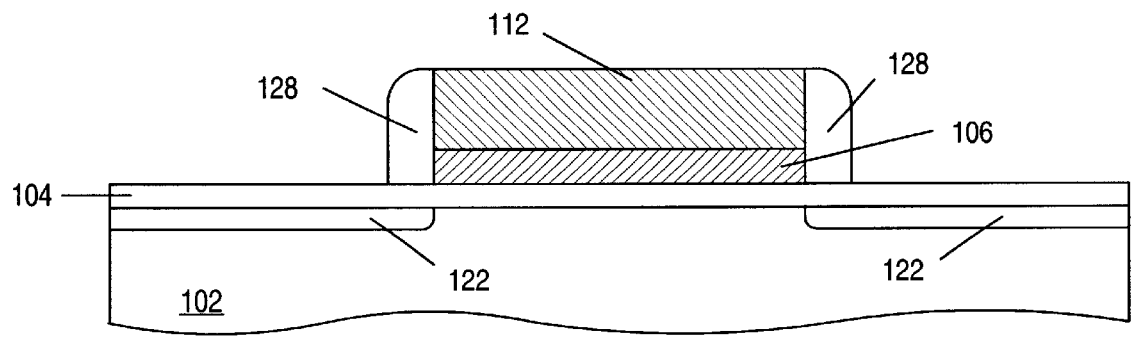
FIG. 6 is a processing step subsequent to FIG. 5, in which spacer structures are formed on sidewalls of the gate conductor.

FIG. 6 illustrates the formation of spacer structures 128 adjacent to gate conductor 112. Portions of gate dielectric layer 106 which are not directly under the gate conductor 112 are preferably removed by a dry etch process, e.g., a plasma etch. The process conditions are chosen such that the gate dielectric layer is removed with high selectivity against removal of the underlying barrier layer 104. After removal of the exposed portions of gate dielectric layer 104, a pair of spacer structures 128 are formed on side walls of gate conductor 112. A spacer material is deposited from a CVD apparatus across the entire substrate to form a conformal layer. Spacer material may be formed from silicon dioxide, silicon nitride, or silicon oxynitride. After deposition, the spacer material undergoes an anisotropic etch. Anisotropic etch is designed as a plasma etch employing both physical and chemical removal mechanisms. Ions are bombarded at an angle substantially perpendicular to substrate 102 upper surface. This causes substantially horizontal surfaces to be removed faster than substantially vertical surfaces. Accordingly, anisotropic etching removes a portion of the spacer material existing over horizontal surfaces. In this manner, spacer structures 128 are formed in those regions near substantially vertical surfaces (i.e., regions adjacent to gate conductor 112).

Figure 7:
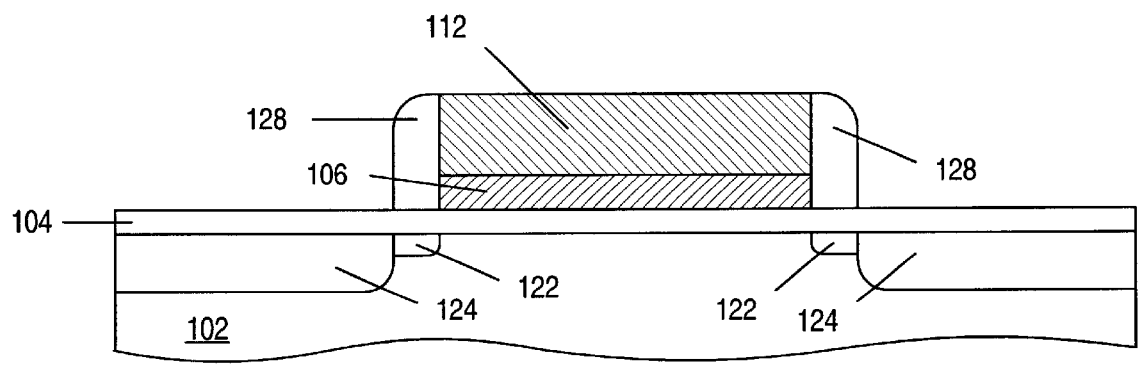
FIG. 7 is a processing step subsequent to FIG. 6, in which a second dopant distribution is forwarded into the semiconductor substrate.

FIG. 7 illustrates an implantation of a second dopant distribution into the source drain regions of substrate 102. Source and drain implant areas 124 may be formed by implanting dopant ions substantially perpendicular to the surface of semiconductor substrate 102. Preferably, the second dopant implant is performed at a higher concentration and a higher energy than the first dopant implant. Spacer structures 128 together with gate conductor 112 preferably serve to mask a portion of the lightly doped drain regions 122 of semiconductor substrate 102 such that substantially no ions from the source/drain implant are implanted into the lightly doped drain areas 122.

It will be appreciated to those skilled in the art having the benefit of this disclosure that this invention is believed to provide a method for incorporating barrier atoms in a gate dielectric/substrate interfacial region using gas cluster ion beam implantation. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor comprising:

a barrier layer arranged upon a semiconductor substrate, wherein the barrier layer comprises a nitrogen doped silicon epitaxial layer;

a gate dielectric arranged upon an upper surface of the barrier layer; and a gate conductor arranged upon an upper surface of the gate dielectric.

2. The transistor of claim 1, wherein the nitrogen doped silicon epitaxial layer is arranged upon a silicon epitaxial layer.

3. The transistor of claim 2, wherein the silicon epitaxial layer comprises a depth of up to about 3 $\mu$m, and wherein the nitrogen doped silicon epitaxial layer comprises a depth of up to about 0.3 $\mu$m.

4. The transistor of claim 1, further comprising:

sidewall spacer structures extending laterally from sidewall surfaces of the gate conductor;

lightly doped drain areas arranged within the semiconductor substrate directly beneath the sidewall spacer structures; and source and drain regions arranged within the substrate laterally adjacent the lightly doped drain areas a spaced distance from the gate conductor.

5. The transistor of claim 1, wherein the barrier layer comprises greater than about 4% nitrogen.

* * * * *